United States Patent [19]

Bayer et al.

[11] Patent Number: 5,345,453
[45] Date of Patent: Sep. 6, 1994

[54] CIRCUIT ARRANGEMENT FOR SAMPLING A BINARY SIGNAL

[75] Inventors: Ludwig Bayer; Michael Behrens, both of Nuremberg, Fed. Rep. of Germany

[73] Assignee: U.S. Philips Corporation, New York, N.Y.

[21] Appl. No.: 980,816

[22] Filed: Nov. 24, 1992

[30] Foreign Application Priority Data

Nov. 29, 1991 [DE] Fed. Rep. of Germany ....... 4139340

[51] Int. Cl.$^5$ .............................................. G06F 11/00
[52] U.S. Cl. ................ 371/68.1; 307/272.2; 307/443
[58] Field of Search ....................... 371/21.2, 22.5, 36, 371/68.1, 68.2; 307/443, 272.2, 289

[56] References Cited

U.S. PATENT DOCUMENTS 4,513,387  4/1985  Neyer .................................. 364/718
4,999,528  3/1991  Keech ................................. 307/279

OTHER PUBLICATIONS

"Control Metastability in High–Speed CMOS Circuits" T. Browns, Electronic Design, Sep. 26, 1991, pp. 74–80.

Primary Examiner—Vincent P. Canney
Attorney, Agent, or Firm—Bernard Franzblau

[57] ABSTRACT

A sampling circuit for sampling a binary signal and producing an output signal representative of a particular sample of the binary signal. The sampling circuit includes a storage unit to store successive samples of the binary signal which are acquired in a time interval shorter than the time period between two subsequent transitions of the binary signal. A test unit is coupled to the storage unit and is operative to perform the following operations: testing a plurality of successive samples, supplied by the storage unit, for being functionally identical to one another; producing an output signal representative of any of the plurality of successive samples upon detecting the identity; upon detecting the absence of identity among the plurality of samples: testing a further plurality of successive samples, supplied by the storage unit, for being functionally identical to one another; producing an output signal representative of any of the further plurality of successive samples upon detecting identity among the further plurality of samples; and upon detecting the absence of identity among the further plurality of successive samples, producing an output signal representative of a predetermined substitute.

13 Claims, 3 Drawing Sheets

CIRCUIT ARRANGEMENT FOR SAMPLING A BINARY SIGNAL

BACKGROUND OF THE INVENTION

This invention relates to a sampling circuit for producing an output signal representative of a particular sample of a binary signal.

A circuit arrangement of this kind is used, for example, in an interface circuit which receives a digital signal. The interface circuit performs an adaptation to the clock frequency of a subsequent circuit. The state of the digital signal is then stored in a bistable element or latch. The input stage of such a bistable element comprises, for example, complementary transistors (for example, CMOS inverters). The digital signal is sampled each time in response to the occurrence of an edge of a clock signal applied to the circuit arrangement. The clock signal (the sampling signal) and the digital signal (the signal to be sampled) should have the same nominally frequency, but may exhibit a very small frequency deviation which usually changes also when viewed over a prolonged period of time.

When the digital signal is sampled during the transition of the signal level, undefined and metastable states may occur in the bistable element. During a metastable state, the signal level is not unambiguously "0" or "1".

In order to avoid a metastable state in the input stage of a bistable element, provisions are known from, for example, the publication "Control metastability in high-speed CMOS circuits" by T. Bowns, Electronic Design, 26.09.1991, pp. 74 to 80, notably page 78, left-hand column, third paragraph, which describes the series connection of two or three bistable elements. This is referred to as multi-stage synchronization. When the first bistable element enters a metastable state, such a state will probably disappear before the next bistable element is clocked.

It is an object of the invention to provide a circuit arrangement of the kind set forth which avoids the effects of metastable states in a bistable element.

SUMMARY OF THE INVENTION

A sampling circuit for producing an output signal representative of a particular sample of a binary signal in accordance with the invention is characterized in that the sampling circuit comprises:

a storage means to store successive samples of the binary signal, the samples being acquired in a time interval shorter than a time period between two successive transitions of the binary signal;

a test means being coupled to the storage means and being operative to perform the following operations:

testing a first plurality of successive samples, supplied by the storage means, to determine if they are functionally identical to one another;

producing an output signal being representative of any of the first plurality of the successive samples upon detecting the identity;

upon detecting an absence of identity among the first plurality:

testing a further plurality of the successive samples, supplied by the storage means, to determine if they are functionally identical to one another;

producing an output signal representative of any of the further plurality of the successive samples upon detecting the identity among the further plurality of samples;

upon detecting the absence of identity among the further plurality of successive samples, producing an output signal representative of a predetermined substitute.

In the invention, the binary signal is sampled a couple of times. A first plurality of samples are tested for identity to produce the output signal if the first plurality is internally consistent. If no identity is found owing to, for instance, a transition occurring in the binary signal during the acquisition of the first plurality, a further plurality of samples is tested to produce the output signal in case this further plurality is internally consistent. If neither plurality is internally consistent, for instance as a consequence of both said transition occurring and an unintended signal fluctuation occurring due to noise, a substitute value is produced. Note that the first and further pluralities may be completely disjunct or partially overlapping.

Consequently, the output signal unambiguously represents a logic state, free from possible metastable effects.

One embodiment of the invention is characterized in that the storage means comprises:

first and further pluralities of input bistable elements to store the first and further pluralities of samples;

a timing circuit to sequentially enable the input bistable elements for sequentially sampling the binary signal.

The bistable elements are sequentially enabled and thus store successive sample values. The first plurality thereof accounts for the test results of the first plurality of successive samples and the further plurality accounts for the further plurality of successive samples. Upon being loaded, the bistable elements are examined groupwise regarding mutual consistence of their contents.

The sampling operations form a sampling cycle whose duration must be shorter than the time wherein the binary signal is valid. The time intervals between the sampling operations may, but need not, be equal and may be derived, for example, from the clock signal of the circuit arrangement.

As a result of the steps taken in accordance with the invention, a metastable state which could occur in the storage means (e.g. flip flop) will not be transferred to an output.

A further embodiment is characterized in that the test means comprises:

a first comparison means coupled to the storage means to mutually compare the first plurality of samples;

a further comparison means coupled to the storage means to mutually compare the further plurality of samples;

a control device connected to the first and further comparison means to produce a first or a further control signal upon the first or further comparison means detecting identity, respectively;

a multiplexing means coupled to the storage means and to the control device to transfer the particular sample, selected out of the first or further pluralities of stored samples, to a multiplexing output under control of the first or further control signal, respectively.

In this embodiment, the multiplexer transfers the value of a particular sample to the multiplexer output when the relevant comparison means gives the green light.

For instance, the storage means may comprise a first and a second bistable element for storing a pair of successive sample values and a third and a fourth bistable element for storing another such pair. This embodiment of the circuit comprises four input bistable elements, each of which is operative to store a respective signal value of four successive sampling operations. After completion of all four sampling operations, the signal values of the first and the second sampling operation and the signal values of the third and the fourth sampling operation are compared. Subsequent to the comparison, a control circuit applies a signal value to an output bistable element.

For the comparison of the signal values of the first and the second sampling operation and the signal values of the third and the fourth sampling operation, there are provided respective comparators which are coupled to the outputs of the input bistable elements.

Subsequent to the comparison, one signal value of the four sampling operations is transmitted to, e.g. an output bistable element. To this end, there is provided a multiplexer which is controlled by the control circuit and which couples the input bistable elements to the output. The multiplexer is operative to couple to the output either the output of the input bistable element serving to store the signal value of the first sampling operation or the output of the input bistable element serving to store the signal value of the third sampling operation.

This embodiment may also comprise an enable circuit which successively enables each time one of the four input bistable elements so as to store a signal value.

Another embodiment is characterized in that the further plurality of successive samples is stored in the storage means upon detection of the absence of identity among the first plurality.

This embodiment stores the further plurality of samples only when the examination of the first plurality of samples reveals that these samples are not mutually identical. This conditional storing saves processing power in case the first plurality of samples are mutual consistent.

An implementation of this embodiment is characterized in that the test means comprises:

a comparison means to test the identity among the first plurality of samples stored in the storage means, for producing the output signal upon detection of the identity and for producing a control signal upon detection of the absence of the identity;

an enabling means coupled between the comparison means and to the storage means for enabling the storage of the further plurality of the samples in the storage means upon reception of the control signal.

The storage means may comprise a first plurality of bistable elements for storage of the first plurality of samples and for storage of the further plurality of the samples under control of the enabling means. In the latter case, the contents of the bistable elements is simply written over. To simplify storage operation and to save time, the bistable elements may be arranged in cascade, i.e., a next one of the bistable elements receives a sample stored in a preceding one of the bistable elements upon the cascade being enabled. The case for two bistable elements is now considered.

When the signal values of the first and the second samples do not correspond, the signal values of the third and the fourth samples are compared. The probability that the signal values of the first and the second samples will not correspond again during the next sampling cycle is very high. Therefore, after the storage of the signal values of the third and the fourth samples, the comparison means again compares only the signal values of the third and the fourth samples.

When it is found that the signal values of the third and the fourth samples do not correspond, the signal values of the first and the second samples are not compared again, but a substitute value is issued. In the case of non-correspondence of the signal values of the third and the fourth samples, the first means is thus operative to apply a predetermined value (substitute value) to the output bistable element. The twice successive storage of a possibly incorrect signal value in the output bistable element thus is prevented.

BRIEF DESCRIPTION OF THE DRAWINGS

Embodiments of the invention will be described in detail hereinafter with reference to the accompanying drawings, in which.

DETAILED DESCRIPTION OF THE PREFERRED EMBODIMENT

Figure 1:
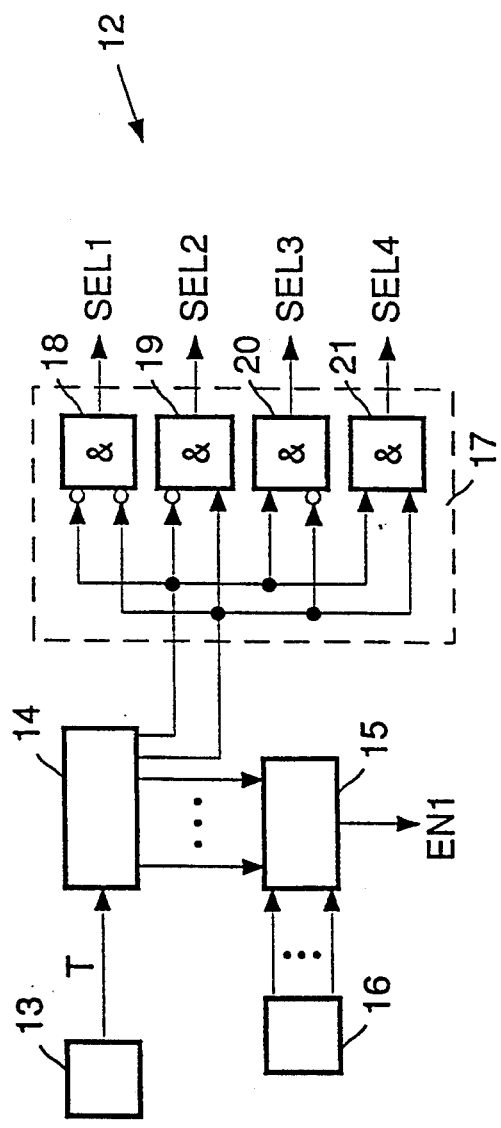
FIGS. 1 and 4 show two embodiments of a circuit arrangement for sampling a binary signal.
Figure 1:
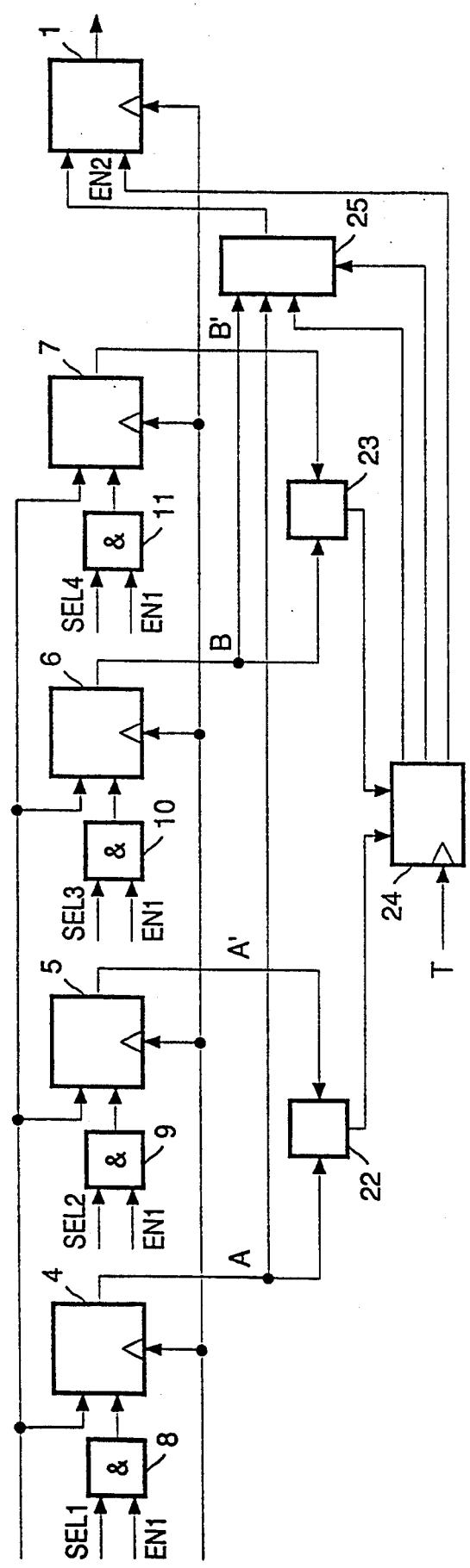
Figure 2:
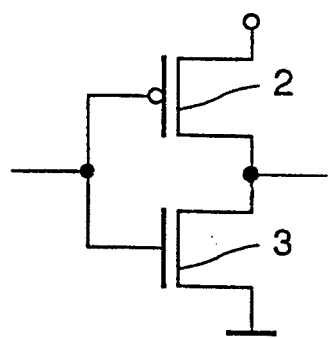
FIG. 2 shows an input stage of input and output bistable elements used in the embodiments shown in the FIGS. 1 and 4.

The circuit arrangement for sampling a binary signal is shown in FIG. 1 wherein, said signal comprises an output bistable element 1 in which signal values are stored. Such an output bistable element 1 stores a signal value present at its input in the presence of an enable signal and the active edge of a clock signal. After a small delay, the signal value becomes available at the output of the output bistable element 1. The input stage of such an output bistable element 1 comprises, for instance, two complementary transistors (CMOS transistors) 2 and 3 (FIG. 2). The gate of the n-channel field effect transistor 2 and the gate of the p-channel field effect transistor 3 are interconnected and constitute the input of the output bistable element 1. The source of the transistor 2 and the drain of the transistor 3 are interconnected and constitute the connection to further stages of the output bistable element 1. The source of the transistor 3 is connected to ground and the drain of the transistor 2 is connected to a supply voltage.

Metastable states are liable to occur in such an input stage. A metastable state occurs when the active edge of a clock signal changes over from "0" to "1" or vice versa exactly at the signal transition (change of state).

In order to avoid a metastable state in the output bistable element 1, the circuit arrangement comprises four input bistable elements 4 to 7 also composed of complementary transistors. The signal is applied to an input of each input bistable element 4 to 7 and a clock signal T is applied to the clock input of each input bistable element 4 to 7. The enable input of each input bistable element 4 to 7 is connected to an AND-gate 8 to 11, which gates receive respective signals from an enable circuit 12.

The enable circuit 12 comprises a clock generator 13, a counter 14, a comparator 15, a read-only memory 16, and a decoder 17 comprising four AND-gates 18 to 21. The clock generator 13 applies the clock signal T to the counting input of the counter 14. The two least-significant outputs of the counter are connected to the decoder 17. The remaining, more-significant outputs of the counter 14 are connected to inputs of the comparator 15. Other inputs of the comparator 15 are coupled to outputs of the read-only memory 16. The comparator 15 outputs an enable signal EN1 when the value supplied by the counter 14 is identical to the value stored in the read-only memory 16.

The two least-significant outputs of the counter 14 are connected to respective inputs of each of the AND-gates 18 to 21. The least-significant output of the counter 14 is connected to an inverting input of the AND-gate 18, to an inverting input of the AND-gate 19, to a non-inverting input of the AND-gate 20 and to a non-inverting input of the AND-gate 21. The other output of the counter 14 is connected to another inverting input of the AND-gate 18, to a non-inverting input of the AND-gate 19, to an inverting input of the AND-gate 20, and to the other non-inverting input of the AND-gate 21. The outputs of the AND-gates 18 to 21 deliver selection signals SEL1 to SEL4.

The enable signal EN1 is applied to an input of each AND-gate 8 to 11. The second input of the AND-gate 8 receives the selection signal SEL1, the second input of the AND-gate 9 receives the selection signal SEL2, the second input of the AND-gate 10 receives the selection signal SEL3, and the second input of the AND-gate 11 receives the selection signal SEL4. The enable circuit 12 ensures that signal values are successively stored in the input bistable elements 4 to 7.

For example, when the duration of a time interval between two transitions of the binary signal amounts to 125 $\mu$s and the clock frequency of the clock generator 13 is 40 MHz, the counter is a 13-bit counter. The value stored in the read-only memory 16 may then be decimal 4999 ("1001110001"). When the counter reaches the decimal value 4999, it is reset to 0.

The outputs of the input bistable elements 4 and 5 are connected to inputs of a comparator 22 and the outputs of the input bistable elements 6 and 7 are connected to inputs of a comparator 23. The output of each comparator 22, 23 is coupled to a control circuit 24 which may be, for example a microprocessor. The control circuit 24 also receives the clock signal T. The operation of the control circuit 24 may be as follows:
1. if A=A': then
2. enable output bistable element 1 (EN2:=1) and apply A to the output bistable element 1;
3. otherwise: if A≠A':
4. if B=B'; then
5. enable output bistable element 1 (EN2:=1) and apply B to the output bistable element 1;
6. otherwise: if B≠B': then
7. supply value "1".

When the signal value A of the input bistable element 4 corresponds to the signal value A' of the input bistable element 5, the control circuit 24 generates an enable signal EN2 for the output bistable element 1. Furthermore, a multiplexer 25 is controlled so that the output of the input bistable element 4 is connected to the input of the output bistable element 1. When the two signal values A and A' do not correspond and the signal value B of the input bistable element 6 corresponds to the signal value B' of the input bistable element 7, the enable signal EN2 is applied to the output bistable element 1 and the multiplexer 25 is controlled so that the output of the input bistable element 6 is connected to the input of the output bistable element 1. When the signal value B does not correspond to the signal value B' and signal value A does not correspond to the signal value A', a predetermined value, for example the logic value "1", is applied to the output bistable element 1 by the control circuit 24, via the multiplexer 25.

Figure 3:
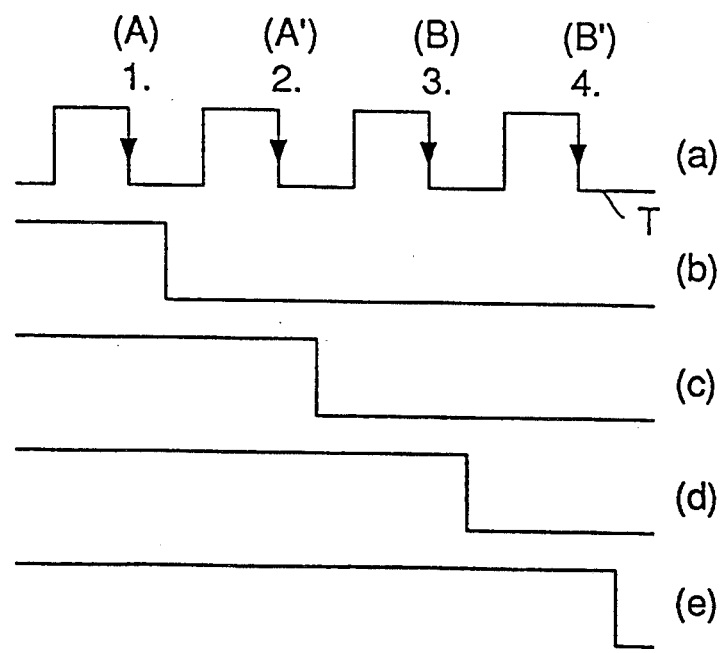
FIG. 3 shows signal waveforms illustrating the operation of the embodiments shown in the FIGS. 1 and 4.

The operation of the circuit arrangement shown in FIG. 1 can also be illustrated on the basis of the signals (a) to (e) shown in FIG. 3. The signal (a) represents the clock signal T which is shown to comprise four pulses. The active edge of the clock signal T is the trailing edge. The binary signal Co) exhibits a signal transition between the first and the second sampling operation. The control circuit 24 thus detects that the signal value A and the signal value A' do not correspond and that the signal values B and B' correspond. The signal (c) exhibits a signal transition between the second and the third sampling operation. In that case the signal values A and A' and the signal values B and B' are identical. The signal value A is then applied to the output bistable element 1. During the next sampling cycle, comprising the duration of the four sampling operations, a signal transition occurs in the signal (d) between the third and the fourth sampling operation. In this case the two signal values A and A' correspond and the signal values B and B' do not correspond. The control circuit 24 applies the signal value A to the output bistable element 1. In the last signal (e) the signal transition occurs after the sampling cycle, i.e. after four sampling operations. In this case the signal values A and A' and the signal values B and B' axe identical. The signal value A is then applied to the output bistable element 1.

Figure 4:
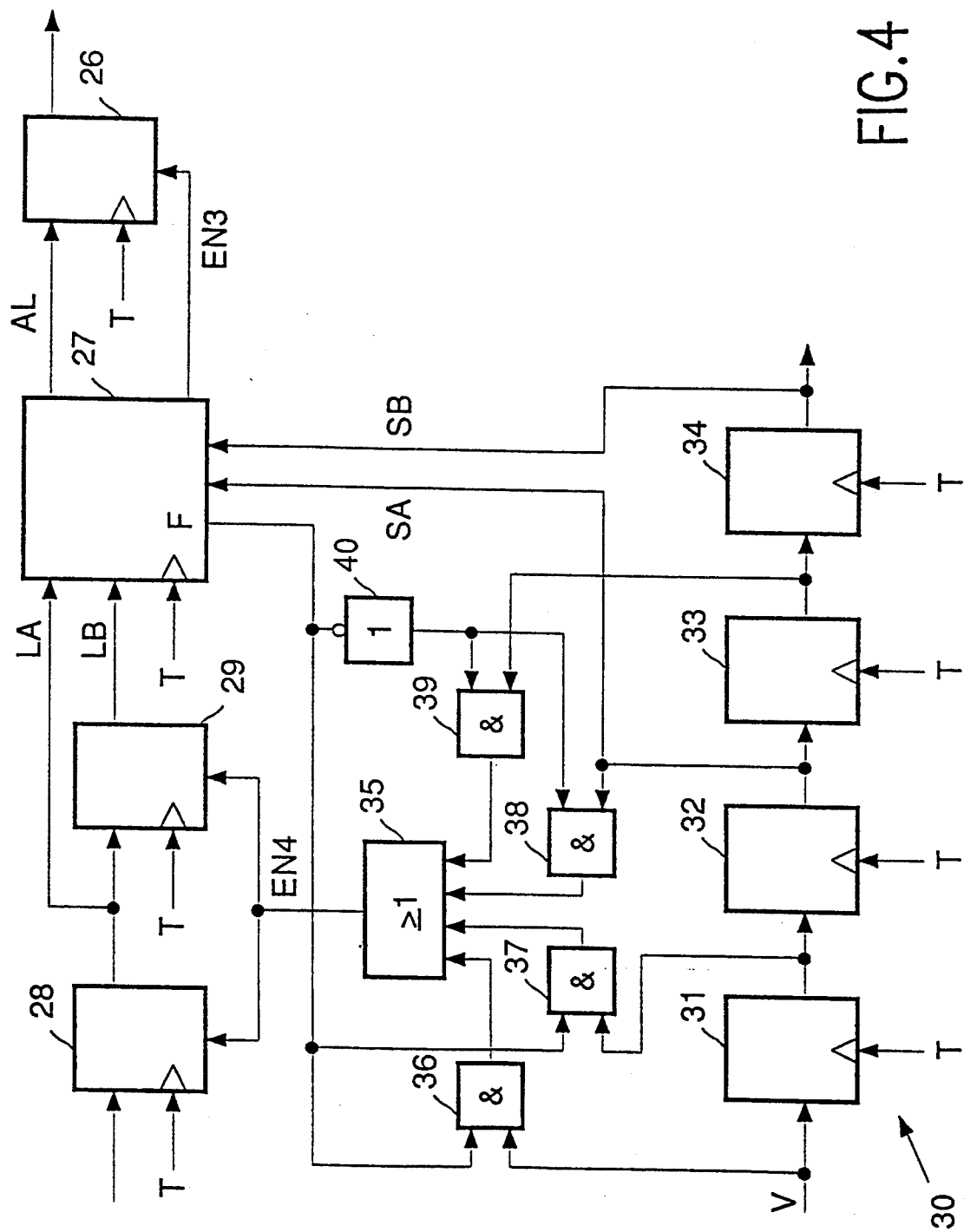

FIG. 4 shows a second embodiment of the circuit arrangement for sampling a signal. This embodiment comprises an output bistable element 26 which receives an enable signal EN3 from a control circuit 27. The signal value AL to be stored is applied to the output bistable element 26 by the control circuit 27. The output bistable element 26 also receives a clock signal T on its clock input.

The control circuit 27 is also connected to the outputs of two input bistable elements 28 and 29 which supply the signal values LA and LB. The input bistable element 28 receives a binary signal on its input. The output of the input bistable element 28 is connected to both the control circuit 27 and the input of the input bistable element 29. The enable inputs of the input bistable elements 28 and 29 axe connected to an enable circuit 30 which supplies an enable signal EN4. The control circuit 27 and the two input bistable elements 28 and 29 also receive the clock signal T.

The enable circuit 30 comprises four series-connected delay bistable elements 31 to 34. The first delay bistable element 31 of the series receives at its input a pulse-shaped start signal V having a pulse duration of, e.g. 25 ns and a repetition rate of 8 kHz. The output of the delay bistable element 31 is connected to the input of the delay bistable element 32 and the output thereof is connected to the input of the delay bistable element 33. The input of the delay bistable element 34 is connected to the output of the delay bistable element 33. The clock inputs of the delay bistable elements 31 to 34 also receive the clock signal T whose clock frequency amounts to 40 MHz in this example.

The input of the delay bistable element 31 is connected to the input of an AND-gate 36, the other input of which is connected to an output F of the control circuit 27. The outputs of the delay bistable elements 31 to 33 are coupled to respective AND-gates 37 to 39.

The other input of the AND-gate 37 is also connected to the output F of the control circuit 27. The respective other inputs of the AND-gates 38 and 39 are connected to an inverter 40 whose input is connected to the output F of the control circuit. The output F of the control circuit 27 supplies a disable signal. The outputs of the AND-gates 36 to 39 are connected to an OR-gate 35 which outputs the enable signal EN4. The output of the delay bistable element 32 also supplies the control circuit 27 with the signal SA and the output of the delay bistable element 34 applies the signal SB thereto.

The enable circuit 30 forms the enable signal EN4 which enables the input bistable elements 28 and 29 so that four sampling operations can be performed on the signal. The disable signal supplied by the output F of the control circuit 27 has a first disable value which is equal to "1" and a second disable value which is equal to "0". The remainder of the operation will be described in detail hereinafter on the basis of the following procedure which takes place in the control circuit 27:
1. If the cycle B is set and SA=1 then:
2. remain in the cycle B and set F:=0;
3. if the cycle A is set and SA=1 then:
    4. if LA=LB then:
        5. AL:=LA;
        6. EN3:=1;
        7. remain in cycle A;
        8. F:=1;
    9. else: if LA≠LB then:
        10. set cycle B;
        11. EN3:=0;
        12. F:=0;
13. else: if cycle B is set and SB=1 then:
    14. if LA=LB then:
        15. AL:=LA;
        16. EN3:=1;
        17. remain in cycle B;
        18. F:=0;
19. else: if AL≠LB then:
    20. AL:=1;
    21. EN3:=1;
    22. set cycle A;
    23. F:=0.

When the control circuit 27 has set a cycle A, first the signal values of the first and the second sampling operation, stored in the input bistable elements 28 and 29, are compared. When the control circuit 27 has set the cycle B, the signal values of the third and the fourth sampling operation are compared. The signal values of the first and the second sampling operation are stored in the two input bistable elements 28 and 29 when the output value of the delay bistable element 32 equals "1" (SA="1"). The signal values of the third and the fourth sampling operation are store in the two input bistable elements 28 and 29 if the output value of the delay bistable element 34 equals "1" (SB="1").

At the beginning the control circuit 27 checks whether the cycle set and the values SA and SB are in synchronism. It is first determined whether the cycle B has been set and the value SA equals "1" If this is the case, the cycle B remains set and the value at the output F of the control circuit 27 is set to "0". This means that no comparison of the signal values of the first and the second sampling operation takes place and that the signal value of the first sampling operation and the signal value of the second sampling operation will not be stored in the input bistable elements 28 and 29.

When the cycle A has been set and the value SA equals "1", it is first checked whether the output values LA and LB of the input bistable elements 28 and 29 are equal. If this is the case, the output value LA is applied to the output bistable element 26 by the control circuit (AL=LA). To this end, the enable signal EN3 must be set to "1". The cycle A remains set and the output F of the control circuit 27 supplies the value "1" (first disable value). The signal values of the third and the fourth sampling operation will not be stored in the input bistable elements 28 and 29.

When the cycle A has been set and the value SA equals "1" and when the output values LA and LB of the input bistable elements 28 and 29 do not correspond, the cycle B is set, the enable signal EN3 becomes equal to "0" and the value at the output F of the control circuit 27 is also set to the value "0" (second disable value). Subsequently, the signal values of the third and the fourth sampling operation are stored in the input bistable elements 28 and 29.

When the cycle B has been set and the value SB equals "1", it is first checked whether the output values LA and LB are identical (signal values of the third and the fourth sampling operation). If this is the case, the output value LA is stored in the output bistable element 26 (AL=LA). At the same time the enable signal EN3 is set to "1". The control circuit 27 remains in the cycle B and does not modify the value of the output F of the control circuit 27 (F="0"). In the event of non-correspondence of the two output values LA and LB of the input bistable elements 28 and 29 when the cycle B has been set and the value SB is "1", a substitute value "1" is applied to the output bistable element 26. The enable signal EN3 is at the same time set to "1" and a return is made to the cycle A. Moreover, the value at the output F of the control circuit 27 is made "1". The writing of a substitute value in the output bistable element 26 prevents the twice successive sampling of an incorrect value.

We claim:
1. A circuit for sampling a binary signal and producing an output signal representative of a particular sample of the binary signal, wherein the sampling circuit comprises:
storage means to store successive samples of the binary signal, the samples being acquired in a time interval shorter than a time period between two successive transitions of the binary signal;
test means coupled to the storage means for
testing a first plurality of successive samples, supplied by the storage means, for being functionally identical to one another; and
producing the output signal being representative of any of the first plurality of the successive samples upon detecting the identity;
upon detecting the absence of identity among the first plurality of successive samples:
said test means testing a further plurality of the successive samples, supplied by the storage means, for being functionally identical to one another; and
producing the output signal being representative of any of the further plurality of the successive samples upon detecting the identity among the further plurality;
upon detecting absence of identity among the further plurality of successive samples, producing the output signal being representative of a predetermined substitute.

2. The sampling circuit of claim 1, wherein the storage means comprises:
- a first and a further plurality of input bistable elements to store the first and further pluralities of samples; and the sampling circuit further comprises;
- a timing circuit to sequentially enable the input bistable elements for sequentially sampling the binary signal.

3. The sampling circuit of claim 1, wherein the test means comprises:
- a first comparison means coupled to the storage means to mutually compare the first plurality of samples;
- a further comparison means coupled to the storage means to mutually compare the further plurality of samples; a control device (24) connected to the first and further comparison means to produce a first or a further control signal upon the first or further comparison means detecting identity, respectively; and a multiplexing means coupled the storage means and to the control device to for transferring the particular sample, selected out of the first or further pluralities of stored samples, to a multiplexing output under control of the first or further control signal, respectively.

4. The sampling circuit of claim 1, wherein the further plurality of successive samples is stored in the storage means upon detection of the absence of identity among the first plurality of samples.

5. The sampling circuit of claim 4, wherein the test means comprises:
- a comparison means to test for identity among the first plurality of samples stored in the storage means, for producing the output signal upon detection of the identity and for producing a control signal upon detection of the absence of the identity; and
- an enabling means coupled to the comparison means and to the storage means for enabling the storage of the further plurality of the samples in the storage means upon reception of the control signal.

6. The sampling circuit of claim 5, wherein the storage means comprises a first plurality of bistable elements for storage of the first plurality of samples and for storage of the further plurality of samples under control of the enabling means.

7. The sampling circuit of claim 6, wherein the bistable elements are coupled in cascade, a next one of the bistable elements receiving a sample stored in a preceding one of the bistable elements.

8. The sampling circuit of claim 1 wherein the first and the further pluralities of samples each are equal to or larger than two.

9. The sampling circuit of claim 2, wherein each bistable element comprises first and second transistors of mutually complementary conductivity type.

10. The sampling circuit of claim 2, wherein the test means comprises:
- a first comparison means coupled to the storage means to mutually compare the first plurality of samples;
- a further comparison means coupled to the storage means to mutually compare the further plurality of samples;
- a control device connected to the first and further comparison means to produce a first or a further control signal upon the first or further comparison means detecting identity, respectively; and
- a multiplexing means coupled to the storage means and to the control device for transferring the particular sample, selected out of the first or further pluralities of stored samples, to a multiplexing output under control of the first or further control signal, respectively.

11. The sampling circuit of claim 2, wherein the first and the further pluralities of samples each are equal to or larger than two.

12. The sampling circuit of claim 6, wherein each bistable element comprises first and second transistors of mutually complementary conductivity type.

13. The sampling circuit of claim 4 further comprising control means coupled to the storage means to test for identity among the first plurality of samples stored in the storage means and for producing a control signal upon detection of the absence of identity, and
- an enabling means coupled to the control means and to the storage means for enabling the storage of the further plurality of samples in the same said storage means upon reception of the control signal.

* * * * *